United States Patent
Funatsu

[19]
[11] Patent Number: 6,077,632
[45] Date of Patent: Jun. 20, 2000

[54] MASK AND DEVICE FOR MANAGING THE SAME

[75] Inventor: Hiroyuki Funatsu, Tokyo, Japan

[73] Assignee: Oki Electric Industry Co., Ltd., Tokyo, Japan

[21] Appl. No.: 09/184,507

[22] Filed: Nov. 2, 1998

[30] Foreign Application Priority Data

Feb. 24, 1998 [JP] Japan .................................. 10-041902

[51] Int. Cl.⁷ ..................................................... G03F 9/00
[52] U.S. Cl. ............................................................ 430/5
[58] Field of Search ........................... 430/5, 9, 22, 322; 356/201

[56] References Cited

U.S. PATENT DOCUMENTS 4,343,877  8/1982  Chiang ........................................ 430/5

FOREIGN PATENT DOCUMENTS 2-283604  11/1990  Japan .
3-109750   5/1991  Japan .
4-171448   6/1992  Japan .

*Primary Examiner*—S. Rosasco
*Attorney, Agent, or Firm*—Jones Volentine, L.L.P.

[57] ABSTRACT

The present invention provides a mask and mask managing device which is capable of managing precisely much information required for the mask. The mask of the present invention includes an IC to/from which information relating to the mask can be written/read out, and a plurality of signal lines which are respectively connected to electrodes of the memory. The memory is connected to a mask information reading/writing unit through the signal lines in order to carry out read and write of the mask information.

13 Claims, 2 Drawing Sheets

MASK AND DEVICE FOR MANAGING THE SAME

BACKGROUND OF THE INVENTION

1. Field of the Invention

The present invention relates to a mask which is used in the photolithography process as one of the process of manufacturing semiconductor integrated circuits, and an device for managing the mask.

2. Description of the Related Art

A mask is an original plate of a circuit pattern which is used to transfer therethrough a circuit pattern of a semiconductor integrated circuit on a wafer. For the purpose of managing the mask, in addition to a circuit pattern, the information such as a name of a semiconductor integrated circuit which will be manufactured by utilizing the mask (or a drawing number of a mask), a name of a possessor, and a calendar in manufacture of the mask is entered in the mask.

In manufacture of the mask, such information is entered in a peripheral portion of the mask in which no circuit pattern is formed. However, since the area of the peripheral portion of the mask is relatively small, it is difficult to enter any information therein. For this reason, the detailed information for each of the masks is retained in a host computer or a document. In addition to the information described above, any relevant information regarding the masks, such as a drawing number of a mask blank, inspection conditions, inspection results, existence and non-existence of mask repair and mask repair positions, a drawing number of a pellicle, cleaning conditions and the number of cleaning, phase differences and the like may be included. In addition, in order to judge the life of the pellicle which is used for protecting the mask and to diagnose any defects of the mask, information relating to the amount of exposure, the target CD (crystal dimension) data, the number of exposure (the total amount of exposure energy), the inspection conditions and the inspection results in periodical inspection, and the yield of LSIs which were manufactured using the masks may be included.

However, conventionally, since the masks and the information thereof are separately managed and also the number of masks is enormous, it is difficult to sufficiently manage the masks.

SUMMARY OF THE INVENTION

In order to solve the above-mentioned problems associated with the prior art, the present invention has been made, and therefore has a first object of the present invention to provide a mask with which much information necessary for using the mask is capable of being precisely managed. In addition, it is a second object of the present invention to provide a device for managing such a mask.

In order to accomplish the first object of the present invention, according to a first aspect of a mask of the present invention, there is provided a mask used in manufacturing a semiconductor integrated circuit, comprises: a mask substrate; a circuit pattern formed by a thin film for shielding an exposing radiation, and which is formed on the mask substrate; an IC to which information relating to the mask substrate and the circuit pattern can be written, and from which the information can be read out; and a plurality of signal lines which are respectively connected to electrodes of the IC in order to connect the IC to an external circuit.

That is, in the present mask, the information relating to this mask can be written to the IC, and hence much information can be managed for each mask. In addition, the information which has already been written to the IC can be read out to an aligner, inspection system and the like through the signal lines, and hence the setting of the exposure conditions, the inspection conditions and the like can be smoothly carried out.

In this connection, the IC is preferably a non-volatile memory.

The signal lines included in the mask may be either the signal lines formed by a conductive thin film which is formed on the surface of the mask substrate, or the signal lines which are formed through the same photolithography process as the process of forming the circuit pattern original drawing on the mask substrate. In addition, these signal lines may also be formed by a chromium (Cr) thin film.

In addition, in order to accomplish the first object of the present invention, according to a second aspect of the mask of the present invention, there is provided a mask used in manufacturing a semiconductor integrated circuit, comprising: a mask substrate; a circuit pattern formed by a thin film for shielding an exposing radiation, and which is formed on the mask substrate; an IC to which information relating to the mask substrate and the circuit pattern can be written, and from which the information can be read out; a power source for backup which serves to supply the IC with electric power; and an optical signal transmitting/receiving unit connected to the IC for transmitting and receiving an optical signal which is obtained by converting the information written to the IC.

In addition, in order to accomplish the first object of the present invention, according to a third aspect of the mask of the present invention, there is provided a mask used in manufacturing a semiconductor integrated circuit, comprising: a mask substrate; a circuit pattern formed by a thin film for shielding an exposing radiation, and which is formed on the mask substrate; a mask information pattern formed on the surface of the mask substrate, which is a circuit pattern, and which has information relating to the mask and the circuit pattern stored therein; and a plurality of signal lines which are formed integrally with the mask information pattern in order to connect the mask information pattern to an external circuit.

In this regard, the mask information pattern and the signal lines may be either formed by a conductive thin film which is formed on the surface of the mask substrate, or those which are formed through the same photolithography process as the process of forming the circuit pattern on the surface of the mask substrate. In addition, the mask information pattern and the signal lines may also be formed of a Cr thin film.

In addition, in order to accomplish the second object, according to a first aspect of a mask managing device of the present invention, there is provided a mask managing device for managing a mask which is used in manufacturing a semiconductor integrated circuit, comprising: a mask in which a circuit pattern used to transfer therethrough the circuit pattern on a substrate is formed on a mask substrate; an IC which is provided on the mask substrate and to which information relating to the mask can be written, and to which the information can be read out; a plurality of signal lines which are formed on the mask substrate, one ends thereof being connected to the electrodes of the IC, respectively, the other ends thereof extending to the outside of the mask substrate; and a mask information reading/writing unit connected to the other ends of the signal lines, respectively, for reading out the information stored in the IC and for writing the information to the IC.

That is, in the mask managing device of the first aspect of the present invention, the IC to/from which the various kinds of information relating to the mask can be written/read out is connected through the signal lines to the mask information reading/writing unit for writing the information to the IC and for reading out the information stored in the IC. For this reason, since reading/writing of the mask information from/to the IC can be carried out, the information of the mask can be surely managed.

In addition, in order to accomplish the second object of the present invention, according to the second aspect of a mask managing device of the present invention, there is provided a mask managing device for managing a mask which is used in manufacturing a semiconductor integrated circuit, comprising: a mask in which a circuit pattern used to transfer therethrough the circuit pattern on a substrate is formed on a mask substrate; an IC which is provided on the mask substrate and to which information relating to the IC can be written, and from which the information can be read out; a power source for backup which serves to supply the IC with electric power; an optical signal transmitting/receiving unit connected to the IC for transmitting/receiving an optical signal which is obtained by converting the information stored in the IC thereinto; and a mask information reading/writing unit for reading out/writing the information stored in the IC through the optical signal transmitting/receiving unit.

In addition, in order to accomplish the second object of the present invention, according to a third aspect of a mask managing device of the present invention, there is provided a mask managing device for managing a mask which is used in manufacturing a semiconductor integrated circuit, comprising: a mask in which a circuit pattern used to transfer therethrough the circuit pattern on a substrate is formed on a mask substrate; a mask information pattern formed on the surface of the mask substrate, which is a circuit pattern, and which has information relating to the mask stored therein; a plurality of signal lines which are formed integrally with the mask information pattern on the surface of the mask substrate in order to connect the mask information pattern to an external circuit; and a mask information reading/writing unit electrically connected to the plurality of signal lines for reading out/writing the information stored in the mask information pattern.

BRIEF DESCRIPTION OF THE DRAWINGS

Other objects and advantages of the present invention will become apparent during the following discussion in conjunction with the accompanying drawings, in which.

DETAILED DESCRIPTION OF THE PREFERRED EMBODIMENTS

The preferred embodiments of the present invention will hereinafter be described in detail with reference to the accompanying drawings.

First Embodiment

Figure 1:
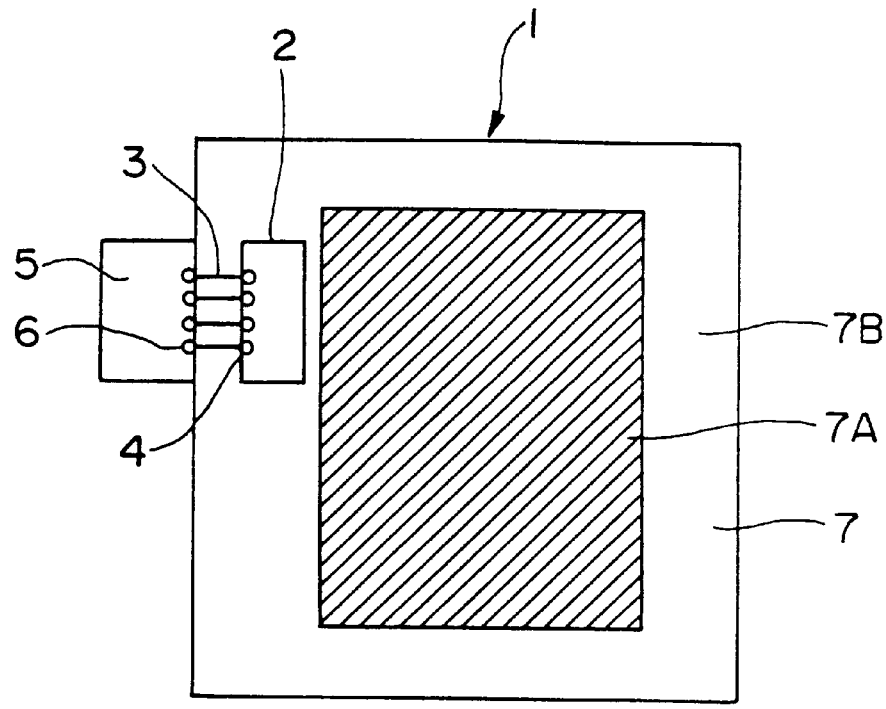
FIG. 1 is a plan view showing the structure of a mask and a mask information reading/writing unit of a first embodiment according to the present invention.

FIG. 1 is a plan view showing the structure of a mask and a mask information reading/writing unit of a first embodiment according to the present invention. As shown in FIG. 1, a mask 1 of the present embodiment includes: a mask substrate 7; a circuit pattern 7A which is formed in a central portion of the mask substrate 7; a mask information reading/writing IC 2 which is formed in a peripheral portion 7B of the mask substrate 7 except for the circuit pattern region 7A; and a plurality of signal lines 3 which are formed in a pattern on the mask substrate 7 in order to connect individual electrodes of the IC 2 to the external circuit. The signal lines 3 are formed so as to extend from the positions of the electrodes of the IC 2 up to the edge portion of the mask 1. Then, one ends of the signal lines 3 are provided with connection terminals 4 which are respectively connected to the electrodes of the IC 2, and the other ends thereof which are located in the edge portion of the mask 1 are provided with connection terminals 6 which are respectively connected to the electrodes of the external circuit.

A mask information reading/writing unit 5 is connected to the IC 2 through both of the signal lines 3 and the connection terminals 4 and 6. By the mask information reading/writing unit 5, the mask information which is previously stored in the IC 2 can be read out and also other information can be written to the IC 2.

Next, the description will hereinbelow be given with respect to the method of manufacturing the mask 1 of the present embodiment. First of all, the space in which the IC 2 is fixed is provided in the peripheral portion 7B of the mask substrate 7. Then, when forming the circuit pattern 7A on the mask substrate 7 through the photolithography process, the signal lines through which each the connection terminals 4 are respectively connected to each the connection terminals 6 are formed of a conductive chromium (Cr) thin film.

For the signal lines 3 which are formed on the mask substrate 7, normally, the Cr metallic thin film can be employed which is the constituent material of the circuit pattern 7A. Therefore, both of the circuit pattern 7A and the signal lines 3 are to be formed on the mask substrate 7 can be formed through the same photolithography process. The connection terminals 4 which are connected to the IC 2 are electrically connected to the ends of the signal lines 3 and also are fixed onto the mask substrate 7 by pressure sensitive adhesive or the like. The connection terminals 6 which are connected to the mask information reading/writing unit 5 is also electrically connected to the other ends of the signal lines 3 and also are fixed to the peripheral portion of the mask substrate 7 by pressure sensitive adhesive or the like.

The IC 2 is fixed onto the mask 1 in either the latter half of the mask manufacturing process or the final process for which both the development or the cleaning are not required at all, and the electrodes (not shown) of the IC 2 are electrically connected to the connection terminals 4 of the signal lines 3, respectively. After having fixed the IC 2 to the mask 1, the various kinds of information relating to the mask 1 are written from the mask information reading/writing unit 5 connected to the connection terminals 6 to the IC 2 through the signal lines 3. In addition, the information which has been written to the IC 2 in such a way can be read out, confirmed and rewritten from and to the mask information reading/writing unit 5 if necessary. If the IC 2 is a non-volatile memory, then the backup power sources will be unnecessary.

The mask information reading/writing unit 5 is the normal microcomputer which is constructed with a microprocessor as the main element. As for the information which is written from the mask information reading/writing unit 5 to the IC 2, there can be listed the following items. For example, there can be listed as the information in manufacture, a drawing number of a mask blank, inspection conditions, inspection results, existence and non-existence of defect correction of the circuit pattern and corrected portions, a drawing number of a pellicle, cleaning conditions and the number of cleaning, phase differences and the like as well as a drawing number of a mask, a name of a possessor, a calendar in manufacture and the like. Then, before using the mask 1, the above-mentioned information is confirmed using the mask information reading/writing unit 5, thereby being able to prevent previously the mask from being used in a wrong way. Further, the results of the periodic inspection after having used the mask can be simply compared with the last inspection results. In addition, the yield information of LSIs which are previously manufactured using the mask 1 is written to the memory 2, readily allowing determination of a defective mask.

For the purpose of preventing foreign substance from adhering to the surface of the mask 1, when using the mask 1, the transparent protection membrane called a pellicle is provided at a fixed distance from the surface of the mask 1. For the purpose of managing accurately the life of the pellicle, the information relating to the amount of exposure energy, the target CD data, the number of exposure (the total amount of exposure energy), the inspection conditions in the periodic inspection, and the like may also be stored as the information in the IC 2.

As described above, according to the present embodiment, since the various kinds of information relating to the mask can be read out/written in real time, the management of the mask can be more accurately carried out. For example, in the process of exposing the circuit pattern 7A formed on the mask 1 onto the wafer using the aligner, the following effects may be realized.

(a) An operator can confirm the ID of the mask on the basis of the drawing number of the mask of which information is stored the IC 2.

(b) Before starting the exposuring process, an operator can confirm the life of the pellicle, which is provided for the mask 1, on the basis of the total amount of exposure energy for the mask 1 the information of which is stored in the IC 2.

(c) Before starting the exposuring process, an operator can confirm the aligner which was used in the past exposuring process using the mask, the intensity of the light, the amount of exposure energy, the pattern size, the number of processed wafers, and the like at the past time on the basis of the information which is stored in the IC 2.

(d) Before starting the exposuring process, an operator can confirm the yield of LSIs which have been manufactured using the mask on the basis of the information which is stored in the IC 2, and hence when it is judged that the mask is the defective mask, the operator can stop speedily the use of the mask.

(e) When the bad yield occurs in the manufactured LSIs, an operator can confirm the use hysteresis of the mask on the basis of the information of the mask of interest used in manufacture of the LSIs which information is stored in the IC 2.

(f) On the basis of the information stored in the IC 2, an operator can confirm the information in manufacture such as the calendar in manufacture of the mask to be used, the drawing number of the used mask blank, the drawing number of the used pellicle, the cleaning conditions, the number of cleaning, the inspection conditions, the inspection results, existence and non-existence of the mask correction and the corrected positions. In the case of a halftone mask, an operator can also confirm, in addition thereto, the information of the phase.

(g) When carrying out the inspection of the mask, an operator can confirm, on the basis of the information stored in the IC 2, the inspection equipment which was used in the past inspection, the inspection conditions therefor, and the inspection results thereof.

(h) An operator can write the confirmation items such as the above-mentioned various kinds of work hysteresis and inspection results from the mask information reading/ writing unit 5 to the IC 2.

(i) Since the mask is managed integrally with the information relating thereto, when using the mask, reading, confirmation and writing of the information relating to the mask can be surely carried out.

(j) The information such as the exposure conditions is previously recorded in the IC 2, and then during the exposuring process, the IC 2 is connected to the computer which is provided in the aligner, whereby the works such as the mask setting, the mask confirmation and the setting of the exposure conditions can be automatically carried out. In addition, after completion of the exposuring process, the information relating to the exposure results by the mask can be automatically written from the computer of the aligner to the IC 2 of the mask 1.

(k) The IC 2 is connected to the various kinds of inspection equipment, whereby the works such as the mask setting, the setting of the inspection conditions, and writing of the inspection results can be automatically carried out.

(l) The IC 2 is connected to the host computer for line management in manufacture of LSIs, whereby the management of the mask can be readily carried out.

Second Embodiment

Figure 2:
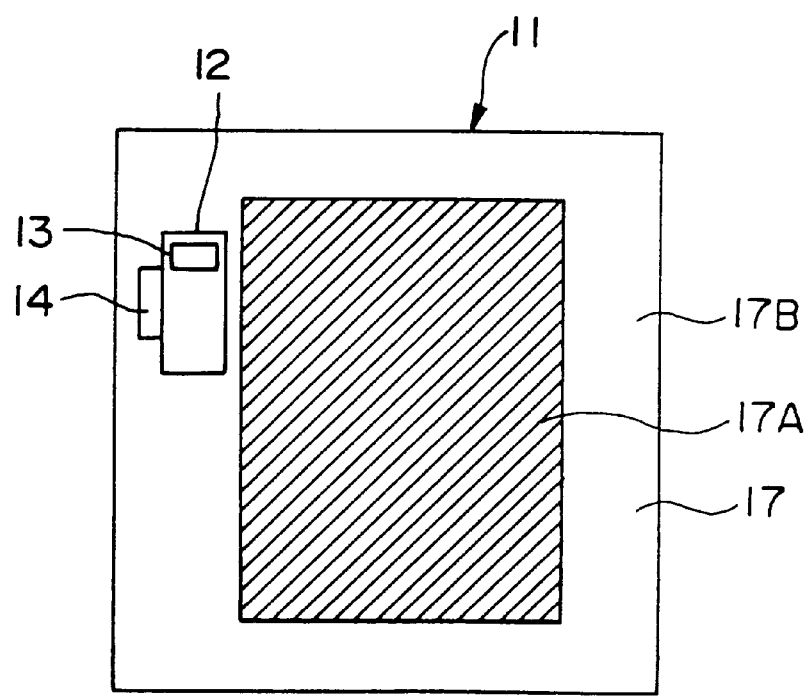
FIG. 2 is a plan view showing the structure of a mask and a mask information reading/writing unit of a second embodiment according to the present invention.

FIG. 2 is a plan view showing the structure of a mask and a mask information reading/writing unit of a second embodiment according to the present invention. According to the second embodiment, an IC includes an optical signal transmitting/receiving unit and a power source for backup, and is characterized in that the transmission/reception of the information to/from a mask information reading/writing unit is carried out in a non-contact manner. The construction of other portions of the mask is the same as that in the above-mentioned first embodiment.

As shown in FIG. 2, in a mask 11 of the present embodiment, a circuit pattern 17A is formed in a central portion of a mask substrate 17, and an IC 12 is fixed to a peripheral portion 17B of the mask substrate 17 except for the circuit pattern 17A. The IC 12 is provided with a power source 13 for backup such as a battery and an optical signal transmitting/receiving unit 14. In addition, while not illustrated, the mask information reading/writing unit for transmitting/receiving the information to/from the IC 12 of the mask 11 is also provided with an optical signal transmitting/receiving unit similarly to the IC 12. For this reason, each information which has been stored in the IC 12 is converted into the associated optical signal to be sent to the mask information reading/writing unit through both of the optical signal transmitting/receiving unit 14 provided in the IC 12 and the optical signal transmitting/receiving unit (not shown) of the mask information reading/writing unit. Likewise, the information is also written in the form of the optical signals from the mask information reading/writing unit to the IC 12.

As described above, according to the second embodiment of the present invention, by providing the power source 13 for backup and the optical signal transmitting/receiving unit 14 in the IC 12, the information can be transmitted/received in a non-contact manner.

Third Embodiment

Figure 3:
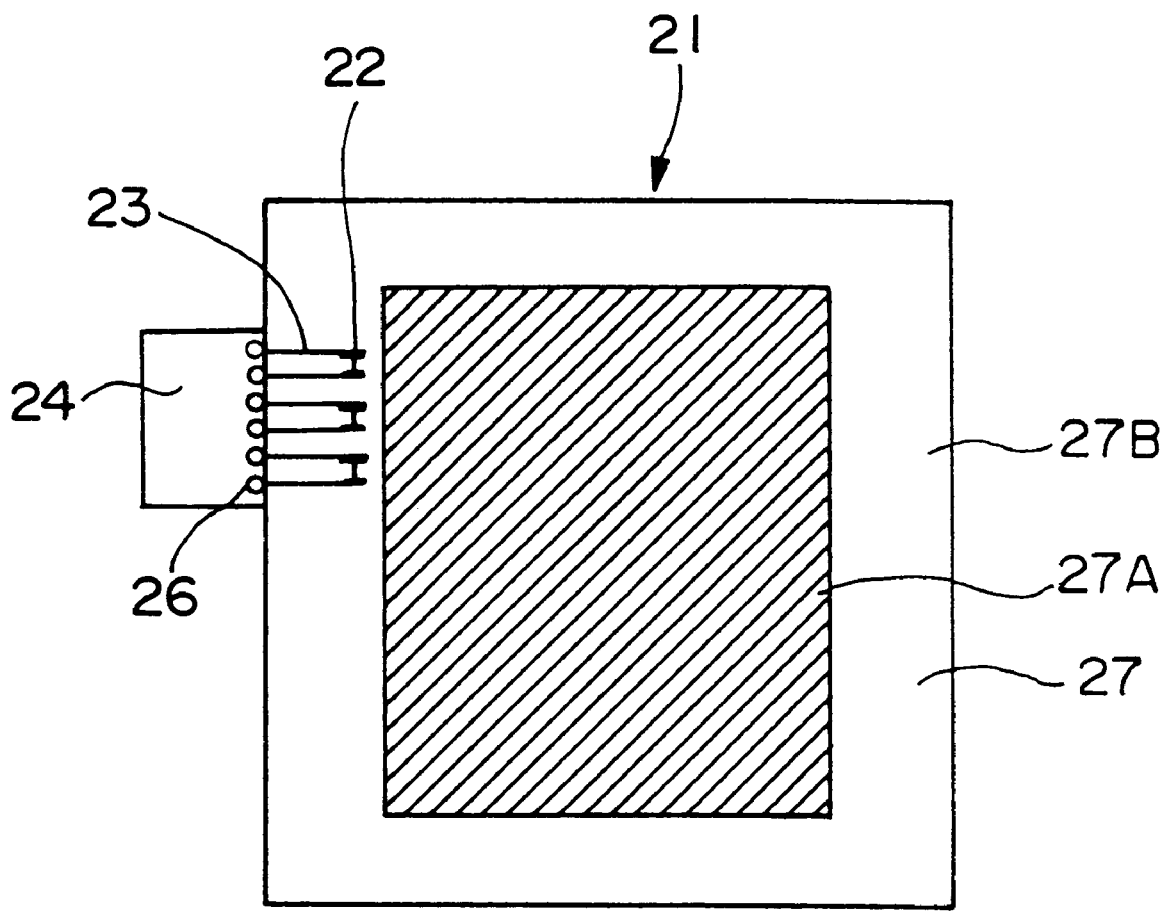
FIG. 3 is a plan view showing the structure of a mask and a mask information reading/writing unit of a third embodiment according to the present invention.

FIG. 3 is a plan view showing the structure of a mask and a mask information reading/writing unit according to a third embodiment of the present invention. According to the present embodiment, it is characterized in that a mask includes, instead of the IC 2 of the first embodiment, a mask information pattern that is formed through the photolithography process, and the construction of other portions is the same as that in the above-mentioned first embodiment.

As shown in FIG. 3, a mask 21 of the present embodiment includes: a mask substrate 27; a circuit pattern 27A which is formed in a central portion of the mask substrate 27; a mask information pattern 22 which is formed in a peripheral portion 27B of the substrate 27 except for the circuit pattern 27A; and a plurality of signal lines 23 which are formed in a pattern in the peripheral portion 27B of the mask 21 in order to connect the mask information pattern 22 to an external circuit. In addition, a plurality of fuses are formed in the mask information pattern 22. Writing of the mask information is carried out on the basis of the combination of fusion and non-fusion of the fuses. In addition, the signal lines 23 are formed integrally with the mask information pattern 22, and the ends of the signal lines 23 which are not connected to the mask information pattern 22 are provided with connection terminals 26 which are to be connected to electrodes of an external circuit, respectively. Then, similarly to the first embodiment, a mask information reading/writing unit 24 is connected to the mask information pattern 22 through both of the signal lines 23 and the connection terminals 26.

Next, the description will hereinbelow be given with respect to the method of manufacturing the mask 21 of the present embodiment. When forming the circuit pattern 27A of the mask 21 through the photolithography process, the mask information pattern 22 and the signal lines 23 are formed on the mask substrate 27 by patterning a conductive thin film. As for a material of the mask information pattern 22 and the signal lines 23, normally, a Cr thin film can be employed which is a constituent material of the circuit pattern formed on the mask 21. Therefore, both of the mask information pattern 22 and the signal lines 23 can be formed together with the circuit pattern through the same photolithography process. The connection terminals 26 are electrically connected to the ends of the signal lines 23, respectively, and are fixed to the peripheral portion of the mask substrate 27 by pressure sensitive adhesive or the like.

The information which has been stored in the mask information pattern 22 is read out by the mask information reading/writing unit 24. In addition, sufficiently large currents are caused to flow through the fuses of the mask information pattern 22 from the mask information reading/writing unit 24 to blow the fuses, thereby being able to rewrite the information of the mask information pattern 22. Then, in the case where all of the fuses of the mask information pattern 22 are blown, the judgement that the mask 21 is the unnecessary mask is carried out. In such a way, the mask information can also be utilized.

As described above, according to the present embodiment, on the basis of the mask information pattern formed on the mask, each information relating to the mask can be read out/written in real time, and hence the management of the mask can be more accurately carried out. For example, in the process of exposing the circuit pattern formed on the mask 21 onto the wafer by utilizing the aligner, the following effects may be realized.

(a) An operator can confirm the ID of the mask on the basis of the drawing number and the like of the mask of which information is written to the mask information pattern 22.

(b) An operator can confirm, on the basis of the information stored in the mask information pattern 22, the information in manufacture of the mask such as the calendar in manufacture of the mask, the drawing number of the used mask blank, and the drawing number of the used pellicle.

(c) When the mask is judged to be defective, the sufficiently large currents are caused to flow through the mask information pattern 22 from the mask information reading/writing unit 24 to blow all of the fuses of the mask information pattern 22, thereby carrying out the representation that the mask is inhibited from being used. As a result, the defective mask can be prevented from being reused by mistake. In addition, the similar write process is also carried out for the mask information pattern of the non-use mask which has already become the old mask, thereby being able to prevent the non-use mask of interest from being reused.

This invention being thus described, it will be obvious that same may be varied in various ways. Such variations are not to be regarded as departure from the spirit and scope of the invention, and all such modifications would be obvious for one skilled in the art intended to be included within the scope of the following claims.

What is claimed is:

1. A mask used in manufacturing a semiconductor integrated circuit, comprising:
   a mask substrate;
   a mask pattern formed on said mask substrate;
   an IC to which information relating to said mask substrate and said mask pattern can be written, and from which said information can be read out; and
   a plurality of signal lines formed on the mask substrate, one end of each of said signal lines being connected to electrodes of said IC and the other end of each of said signal lines being located on an edge portion of the mask substrate.

2. A mask according to claim 1, wherein said IC is a non-volatile memory.

3. A mask according to claim 1, wherein said plurality of signal lines are formed by a conductive thin film which is formed on the surface of said mask substrate.

4. A mask according to claim 1, wherein said plurality of signal lines are formed through the same photolithography process as the process of forming said circuit pattern on said mask substrate.

5. A mask according to claim 1, wherein said plurality of signal lines are formed by a chromium thin film.

6. A mask used in manufacturing a semiconductor integrated circuit, comprising:
   a mask substrate;
   a mask pattern formed on said mask substrate;
   an IC to which information relating to said mask substrate and said mask pattern can be written, and from which said information can be read out;
   a power source for backup which serves to supply said IC with electric power; and
   an optical signal transmitting/receiving unit connected to said IC for transmitting and receiving an optical signal which is obtained by converting the information written to said IC.

7. A mask used in manufacturing a semiconductor integrated circuits, comprising:
   a mask substrate;

a mask pattern formed on said mask substrate;

a mask information pattern formed on the surface of said mask substrate which stores information relating to said mask and said mask pattern therein; and a plurality of signal lines which are formed integrally with said mask information pattern on the mask substrate, one end of each of said signal lines being connected to the mask information pattern and the other end of each of said signal lines being located on an edge portion of the mask substrate.

8. A mask according to claim 7, wherein said mask information pattern and said plurality of signal lines are formed by a conductive thin film which is formed on the surface of said mask substrate.

9. A mask according to claim 7, wherein said mask information pattern and said plurality of signal lines are formed through the same photolithography process as the process of forming said circuit pattern original drawing on said mask substrate.

10. A mask according to claim 7, wherein said mask information pattern and said plurality of signal lines are formed by a chromium thin film.

11. A mask managing device for managing a mask which is used in manufacturing a semiconductor integrated circuit, comprising:

a mask comprising a mask substrate and a mask pattern formed on the mask substrate, the mask pattern used to transfer a circuit pattern onto a substrate;

an IC which is provided on said mask substrate and to which information relating to said mask can be written, and from which said information can be read out;

a plurality of signal lines which are formed on said mask substrate, one end of each of said signal lines being connected to electrodes of said IC, respectively, the other end of each of said signal lines being located on an edge portion of said mask substrate; and a mask information reading/writing unit connected to the other ends of said plurality of signal lines, respectively, for reading out the information stored in said IC and for writing the information to said IC.

12. A mask managing device for managing a mask which is used in manufacturing a semiconductor integrated circuit, comprising:

a mask comprising a mask substrate and a mask pattern formed on the mask substrate, the mask pattern used to transfer a circuit pattern onto a substrate;

an IC which is provided on said mask substrate and to which information relating to said mask can be written, and from which said information can be read out;

a power source for backup which serves to supply said IC with electric power;

an optical signal transmitting/receiving unit connected to said IC for transmitting and receiving an optical signal which is obtained by converting the information stored in said IC thereinto; and a mask information reading/writing unit for reading out/writing the information stored in said IC through said optical signal transmitting/receiving unit.

13. A mask managing device for managing a mask which is used in manufacturing a semiconductor integrated circuit, comprising:

a mask comprising a mask substrate and a mask pattern formed on the mask substrate the mask pattern used to transfer a circuit pattern onto a substrate;

a mask information pattern formed on the surface of said mask substrate which stores information relating to said mask therein;

a plurality of signal lines formed integrally with said mask information pattern on the surface of said mask substrate, one end of each of said signal lines being connected to the mask information pattern and the other end of each of said signal lines being located on an edge portion of the mask substrate; and a mask information reading/writing unit electrically connected to the other ends of said plurality of signal lines for reading out/writing the information stored in said mask information pattern.

* * * * *